(12) United States Patent
Gateman

(10) Patent No.: US 9,857,486 B2
(45) Date of Patent: Jan. 2, 2018

(54) DOCKING STATION

(71) Applicant: MAGSEIS AS, Lysaker (NO)

(72) Inventor: Nils P. Gateman, Märsta (SE)

(73) Assignee: MAGSEIS AS, Lysaker (NO)

( * ) Notice: Subject to any disclaimer, the term of this patent is extended or adjusted under 35 U.S.C. 154(b) by 139 days.

(21) Appl. No.: 14/910,278

(22) PCT Filed: Jan. 18, 2014

(86) PCT No.: PCT/NO2014/050010
§ 371 (c)(1),
(2) Date: Feb. 5, 2016

(87) PCT Pub. No.: WO2015/020528
PCT Pub. Date: Feb. 12, 2015

(65) Prior Publication Data
US 2016/0178771 A1   Jun. 23, 2016

(30) Foreign Application Priority Data
Aug. 6, 2013 (NO) .................................. 20131076

(51) Int. Cl.
*G06F 7/00* (2006.01)
*G01V 1/16* (2006.01)
(Continued)

(52) U.S. Cl.
CPC ............... *G01V 1/164* (2013.01); *G01V 1/38* (2013.01); *G01V 1/3843* (2013.01);
(Continued)

(58) Field of Classification Search
CPC .................................................. G06F 1/1632
See application file for complete search history.

(56) References Cited

U.S. PATENT DOCUMENTS

| 4,780,863 A | 10/1988 | Schoepf |
| 4,942,557 A | 7/1990 | Seriff |

(Continued)

FOREIGN PATENT DOCUMENTS

| WO | 2013/015785 | 1/2013 |
| WO | 2013/015795 | 1/2013 |
| WO | 2015/020528 | 2/2015 |

OTHER PUBLICATIONS

International Search Report issued in PCT/NO2014/050010, dated Jun. 11, 2014, pp. 1-2.

(Continued)

*Primary Examiner* — Yolanda Cumbess
(74) *Attorney, Agent, or Firm* — Jeffery S. Melcher; Manelli Selter PLLC

(57) ABSTRACT

An apparatus for storing control units comprises a cabinet (10) with a plurality of rails (41) arranged horizontally along inner sidewalls and is configured to receive a plurality of drawers (40) above each other. Each drawer (40) comprises a plurality of docking sockets (1), each docking socket (1) being configured to receive and retain one control unit. The apparatus comprises a robotic elevator device (20) adapted to move an elevator table (30) in a vertical direction to a vertical position corresponding to a pair of rails (41) into which a drawer (40) is to be inserted or from which the drawer (40) is to be withdrawn. The elevator table (30) comprises a linear motor (32, 34) capable of moving the drawer (40) along a pair of rails (41) in a longitudinal direction. A robotic gripper, which may be internal or external to the apparatus, is capable of putting control units into the docking sockets or withdrawing the control units from the docking sockets.

15 Claims, 5 Drawing Sheets

(51) Int. Cl.
*G01V 1/38* (2006.01)
*H05K 5/00* (2006.01)
*H05K 5/02* (2006.01)

(52) U.S. Cl.
CPC ......... *H05K 5/0026* (2013.01); *H05K 5/0221* (2013.01); *H05K 5/0247* (2013.01); *H05K 5/0256* (2013.01)

(56) References Cited

U.S. PATENT DOCUMENTS

| | | | |
|---|---|---|---|
| 7,724,607 | B2 | 5/2010 | Ray et al. |
| 7,823,991 | B2* | 11/2010 | Purdy ................ A47B 67/04 206/373 |
| 2011/0217123 | A1* | 9/2011 | Jewell .................. F16L 1/16 405/158 |
| 2013/0058192 | A1 | 3/2013 | Gateman |
| 2014/0069710 | A1* | 3/2014 | Webb .................. H05K 7/14 174/549 |

OTHER PUBLICATIONS

Written Opinion issued in PCT/NO2014/050010, dated Sep. 2, 2016, pp. 1-7.
Accelerated Processing Request filed in UK patent application No. 1602127.1, dated May 17, 2016, pp. 1-2.
Notification of grant of Great Britain Patent No. GB2531228, pp. 1-2.

* cited by examiner

DOCKING STATION

BACKGROUND OF THE INVENTION

The present invention generally relates to equipment for seismic exploration of a subterranean formation, more particularly to an apparatus for storing control units.

For simplicity, numerous details known in the art will be omitted from the following description. However, these details must of course be present in practical implementations.

A conventional seismic survey at sea is performed from a source vessel towing a set of acoustic sources, for example airguns, which are set off at regular intervals in so-called shots. Acoustic waves from the airguns travel through the water into a subterranean formation, where they are reflected and refracted from various strata in the formation. The reflected and refracted waves are detected by sensors and recorded for later analysis in order to provide information about the subterranean structure or formation.

The reflected and refracted waves comprise compression or pressure waves, shear waves, Stoneley waves etc., and are typically detected by different sensors such as geophones and hydrophones.

In order to achieve as much information as possible, the sensors are typically deployed in close acoustic contact with the seafloor. Furthermore, the sensors are conventionally arranged in nodes, each node comprising one or more seismic sensors. The nodes may be deployed or planted one by one, e.g. by an ROV, or they may be connected by an Ocean Bottom Cable (OBC), conventionally at intervals of 25 or 50 meters. Today, methods using OBCs can be loosely divided into to different groups.

The first group comprises methods wherein the nodes transmit seismic signals to the exploration vessel in real time. A first example of methods in this group can be found in U.S. Pat. No. 4,942,557 to Seriff, wherein an airgun generates compression waves and wherein converted shear waves from the formation are detected and corresponding signals are transmitted over a wire to an exploration vessel. A second example can be found in U.S. Pat. No. 4,780,863 to Schoepf wherein the seismic signal is converted to an electrical signal carried over a wire to a buoy on the surface where it is converted to a radio signal and transmitted to the exploration vessel in real-time.

Major shortcoming of the methods from the first group are (a) increased complexity of an ocean bottom cable which must comprise conducting wires as well as protection against stress and abrasion that might harm the conducting wires, (b) increased probability of water leakage through the multiple electrical terminations connecting wires to the electronics within each node and (c) rapidly increasing cost with increasing depth of deployment. The increasing cost is partly due to the length of a cable with a relatively high cost per unit length, and partly due to increased sealing requirements when the depth increases.

The second group comprises methods employing completely autonomous nodes which are left on the seafloor for the duration of a survey, i.e. the period of time during which the data from a series of shots are recorded and stored. After the survey, the autonomous nodes are retrieved to a recording vessel where the recorded seismic data are transferred from the nodes for later analysis. These methods reduce acoustic noise induced by a cable extending from the seafloor to the surface, and they tend to be advantageous at greater deeps, as the seismic sensors, associated electronics and power source can be deployed in a pressure tight housing 24 or shell without conduits for wires that require sealing.

The present disclosure concerns the second group involving autonomous nodes, i.e. methods wherein each node has a separate power source and means for storing data obtained from a survey during which the node resides incommunicado on the seafloor.

US 2013/0058192 A1 to Gateman et al. and assigned to the applicant for the present invention discloses an ocean bottom seismic cable comprising a plurality of seismic node casings separated by stress member sections with acoustic de-couplers, such that the nodes are deployed at predetermined intervals, typically 25 to 50 meters, and such that each node receives a practical minimum of noise from adjacent nodes. Each node casing comprises an autonomous sensor capsule that can be inserted as a unit into a seismic node casing during deployment from a vessel and be removed as a unit from a seismic node casing when the cable is retrieved to the vessel.

The removable sensor capsule is a container made from e.g. steel or titanium that can withstand the pressure at the seafloor. During operation it contains the sensors required to detect the seismic signals and other parameters of interest, at least one battery unit for power supply and at least one control unit comprising hardware, firmware and software required for recording and storing the seismic data obtained during a survey until the control unit is retrieved to the exploration vessel and the seismic data are uploaded for further analysis. Some signal processing may also be performed by the control unit.

The battery unit and control unit are conveniently releasable connected to form a control/battery-unit. US 2013/0058192 A1 discloses an embodiment in which two control/battery-units are redundantly disposed at opposite ends of the sensor capsule.

Consider next the deck of an exploration vessel for performing a seismic survey. Space is at a premium, and must be provided for drums for various cables such as streamers containing acoustic sources and ocean bottom cables comprising SSRs. Space is also required for equipment used to deploy and retrieve the various cables, e.g. one or more winches, ROVs, cranes etc. In addition, batteries may be considered a safety risk and for this reason regulations may require a separate storage space for batteries.

Thus, there is a general need for effective use of space on the deck of a survey vessel. In particular, there is a need for effective handling of sensor capsules aboard the vessel before they are deployed and after they are retrieved.

[Application, inventors Jan Gateman & Nils Gateman] assigned to the applicant for the present invention, discloses a method for handling sensor capsules in which assembly involves the steps of connecting a control unit to a battery unit, preferably by relative axial and rotational motions between the battery unit and the control unit, and inserting the resulting control/battery unit into a sensor capsule. The application further discloses automated disassembly of the sensor module, including storing the battery unit, the control unit and the sensor capsule in drawers and/or drawers that are subsequently inserted into cabinets. A docking station for control units is also disclosed. The docking station comprises several drawers, each with several docking sockets—one docking socket per control unit. An automated assembly inserts the control units into a docking socket by a combination of axial motion and rotation and removes the battery unit after the control unit is connected to a power source through the docking socket. Thus, the control unit conveniently has one power inlet from the battery unit at a first end, and a second power inlet at an opposite end for power supply through the docking socket.

The present invention relates to a docking station for use in a method disclosed in [Application, inventors Jan Gateman & Nils Gateman]. For convenience, the automated assembly used to insert and withdraw control units from the docking sockets is termed a "robotic gripper" in the following. From the description above, it is understood that the robotic gripper is able grip a generally cylindrical item, to position the item over a docking socket, to move the item axially, and to rotate the item about its cylinder axis.

The control unit may comprise a CPU capable of executing instructions in software, e.g. in order to process the detected seismic signals before they are stored. Similar tasks can be performed by hardware, for example implemented in programmable arrays of logic gates, and the control unit may hence comprise programmable hardware. Further, the control unit may contain firmware, timers and other components known in the art. Software, firmware and programmable hardware require tests to insure their integrity and functionality, e.g. reading a version number. Furthermore, the software, firmware and programmable hardware may require an update or upgrade from time to time. The above and similar tasks are referred to as "test and maintenance" in the following.

The docking station disclosed in [Application, inventors Jan Gateman & Nils Gateman] comprises power supply and capabilities for uploading data from all control units inserted into it. The docking station does not cover the need for test and maintenance, e.g. calibrating sensors, updating software etc. Furthermore, keeping all control units electrically connected in docking sockets at all times is expensive.

The objective of the present invention is to solve or alleviate at least one of the problems above while keeping the benefits of prior art.

SUMMARY OF THE INVENTION

This is achieved by an apparatus for storing control units according to claim 1.
apparatus for storing control units

BRIEF DESCRIPTION OF THE DRAWINGS

The invention will be explained in greater detail by means of an exemplary embodiment with reference to the accompanying drawings, in which.

DETAILED DESCRIPTION OF A PREFERRED EMBODIMENT

Figure 1:
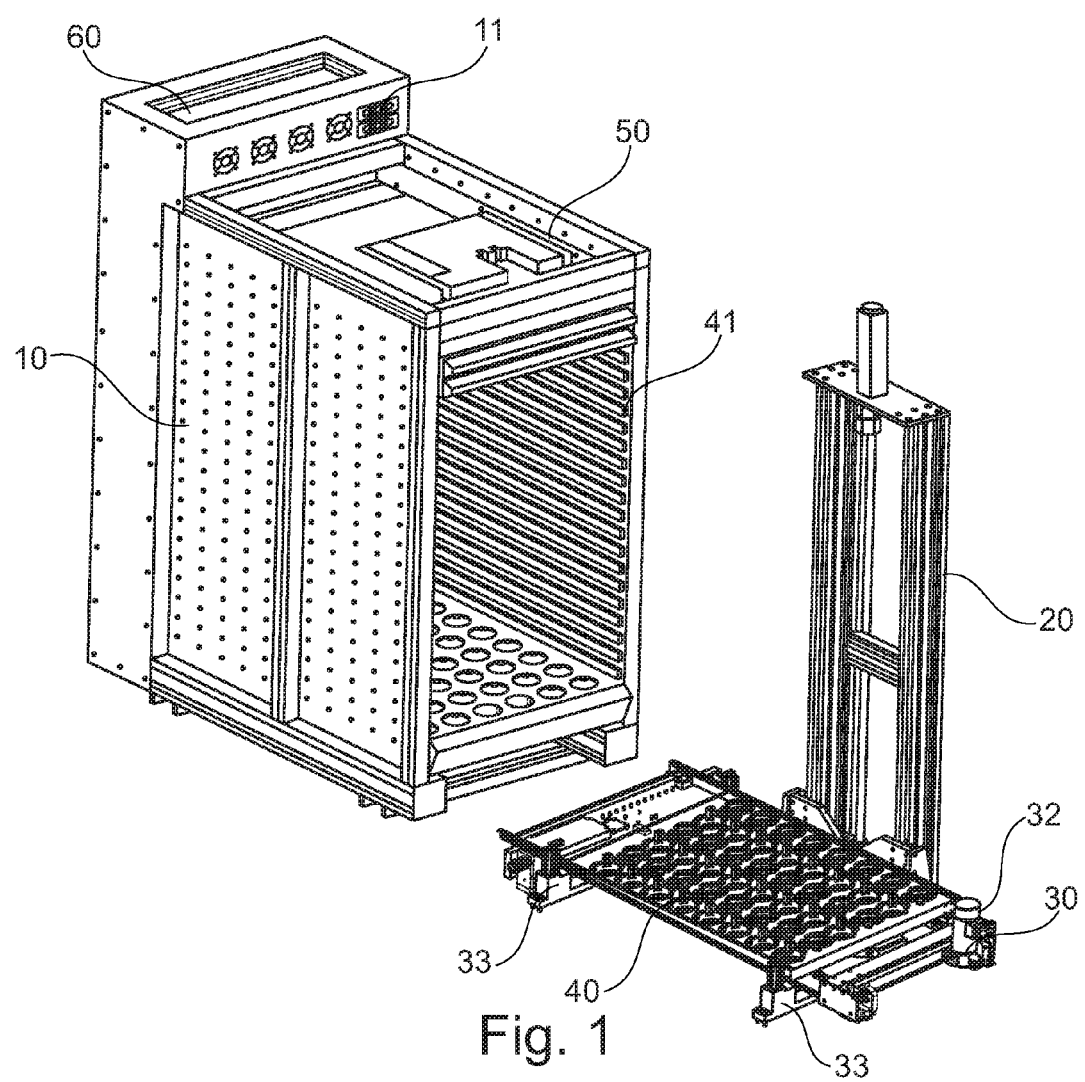
FIG. 1 is a perspective view of an apparatus for storing control units.

FIG. 1 illustrates an apparatus for storing control units. The main parts are a cabinet 10 with several rails 41 that are accessible from a front side and a robotic elevator mechanism 20, 30 disposed in front of the cabinet 10. The elevator mechanism is configured to insert a drawer 40 into a predetermined rail 41, and to retrieve the drawer 40 from the cabinet 10 when desired.

More particularly, the elevator mechanism comprises an elevator 20 capable of moving an elevator table 30 up and down in a vertical direction in order to align the drawer 40 residing on the elevator table 30 with a predetermined rail 41 of a plurality of rails 41 arranged above each other within the cabinet 10. The elevator table 30 is capable of moving the drawer 40 in a longitudinal direction perpendicular to the vertical direction in order to push the drawer 40 into a rail 41 or to pull the drawer 40 out of the rail 41, respectively. Of course, the roll, pitch and yaw of an exploration vessel at sea will cause the above "vertical" axis to deviate from a truly vertical axis and the plane perpendicular to the "vertical" axis to deviate from a truly horizontal plane. However, the terms vertical and horizontal are used herein for convenience. Further, the vertical, longitudinal and lateral axes herein are always mutually perpendicular to each other, regardless of their actual orientation with respect to the "true" horizon.

Preferably, guides or markers are disposed on the cabinet 10 and corresponding readers on the elevator mechanism in order to calibrate the elevator mechanism. For example, tapered, mechanical guides at each rail 41 may be employed to guide the drawer 40 to the rail 41. Alternatively, optical markers can be disposed on the front of the cabinet 10 in known positions, and a light sensitive sensor on the elevator table 30 can provide input to a controller to adjust the elevator table vertically and possibly laterally in a calibration procedure such that the drawers 40 can be exactly aligned with the rails 41 during operation. Similarly, micro switches within the cabinet can raise a signal to stop the longitudinal motion when the drawer 40 is fully inserted in the cabinet. Such markers and sensors are commercially available, and it is left to the skilled person to choose suitable means for calibration and control.

The drawer 40 comprises several docking sockets arranged in columns in the longitudinal direction and rows in the lateral direction. Each docking socket is configured to receive one control unit. A robotic gripper is provided for putting the control units into the docking sockets and for withdrawing them. However, the robotic gripper or similar device need not be part of the present apparatus, i.e. it may be external to the apparatus. In one embodiment, the upper face of elevator table 30 is provided with optical markers for a robotic gripper such that the robotic gripper can be calibrated to hit the docking sockets in a manner similar to the calibration discussed above.

Figure 2:
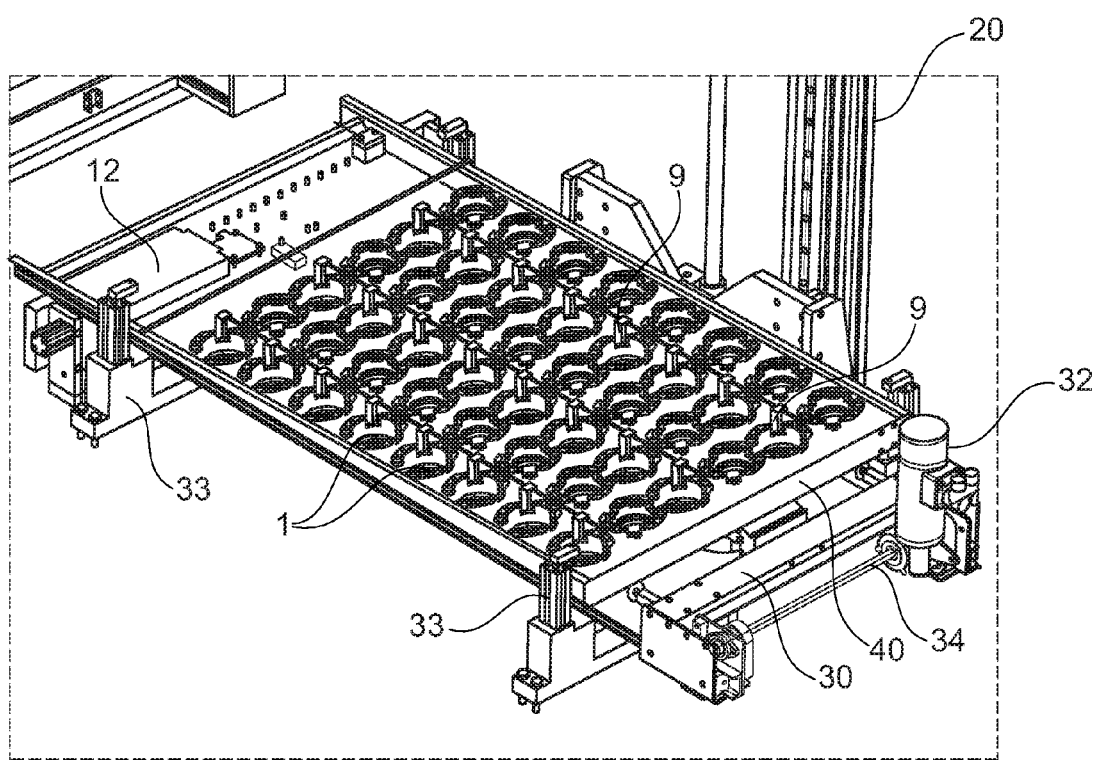
FIG. 2 is an enlarged view of an elevator table visible on FIG. 1.

In another embodiment, shown on FIGS. 1 and 2, the elevator table first pulls the drawer 40 out of the rail 41 and then vertically moves the drawer 40 residing on the elevator table 30 to a fixation position where mechanical alignment means 33 align the drawer into an exact position that will be the same for every drawer 40 pulled out from the cabinet. The robotic gripper will thus only need to be calibrated to a limited number of positions. Furthermore, the mechanical alignment means 33 are preferably mounted on the same frame as the robotic gripper such that any possible misalignment due to ship movements or vibrations is avoided.

The cabinet 10 described so far can be configured to receive a large number of inactive control units, and thus present an inexpensive and efficient storage for the modules.

However, in an important embodiment, the cabinet 10 facilitates data transfer from, and preferably to, control units inserted into docking sockets provided with connectors for power supply and data transfer. This embodiment could be arranged as a temporary docking station wherein data are uploaded from freshly retrieved control units before the control units are stored in less expensive cabinets, for example of the type above. During deployment, the recorders could similarly be retrieved from the less expensive storage and undergo test and maintenance procedures, including synchronizing timers, in the embodiment with electrical connectors. This embodiment is further explained in the following.

In order to remove excess heat generated by many active control units, cooling fans 11 are arranged in the cabinet 10 in order to circulate air within the cabinet 10.

An electronic master unit 50 controls the operation of the cabinet and its contents, and a connector assembly 60 connects the docking sockets to an external controller (not shown on FIG. 1) to which the seismic data are uploaded from the individual control units, and from which instructions for tests and maintenance might be issued.

FIG. 2 is an enlarged view of the elevator table 30 and the drawer 40 with a plurality of docking sockets 1.

A controllable motor 32 and a transmission 34 are able to move the drawer 40 back and forth along the longitudinal axis, i.e. along the rails 41, such that the drawer 40 with docking sockets and control units can be inserted into a rail 41 in the cabinet 10 (FIG. 1) or retrieved therefrom. The motor 32 and transmission 34 act together as a linear motor, and may be replaced with any other kind of linear motor.

The docking sockets 1 are connected through an electric circuit board 9 to an onboard controller 12. The onboard controller 12 comprises electronic circuits to address each docking socket on the drawer 40 individually, to upload data from a control unit inserted in the docking socket and to test, update or upgrade the control unit in the docking socket 1. The onboard controller 12 is addressable and capable of receiving instructions from the electronic master unit 50 (FIG. 1) and to forward seismic survey data and other data to the master unit 50 when requested.

Thus, in some embodiments, the electronic master unit 50 can address each docking socket and the control unit therein directly. However, in a preferred embodiment, many details of addressing control units/docking sockets and controlling data flows are left to the onboard controller 12, which acts on behalf of the electronic master unit. For example, an instruction from the electronic master unit 50 might be "upload all seismic data". As a response, the onboard controller 12 would address each of its docking sockets in turn, and upload the corresponding seismic data in packets, each packet preferably identifying the control unit from which it is uploaded.

The controllers above may conveniently also be used for testing and maintenance of the control units, as they are configured to address each docking socket individually. Testing and maintenance may comprise, but are not limited to, reading a unique ID associated with each control unit, version control of firmware or software, updating or upgrading software, firmware or programmable hardware. An example of a distributed maintenance task might be a software update. In this example, the onboard controller 12 might be supplied with a list of control units requiring, for example, a software update for a signal processing software. The task of actually updating the software of the control units on the list is left to the onboard controller 12. Thus, several onboard controllers 12, each handling a subset of the control units in the cabinet 10, work in parallel to perform the required updates, such that the overall speed of the update increases. In general, distributed onboard controllers 12 increase the efficiency of the apparatus, at least for certain maintenance procedures.

Figure 3:
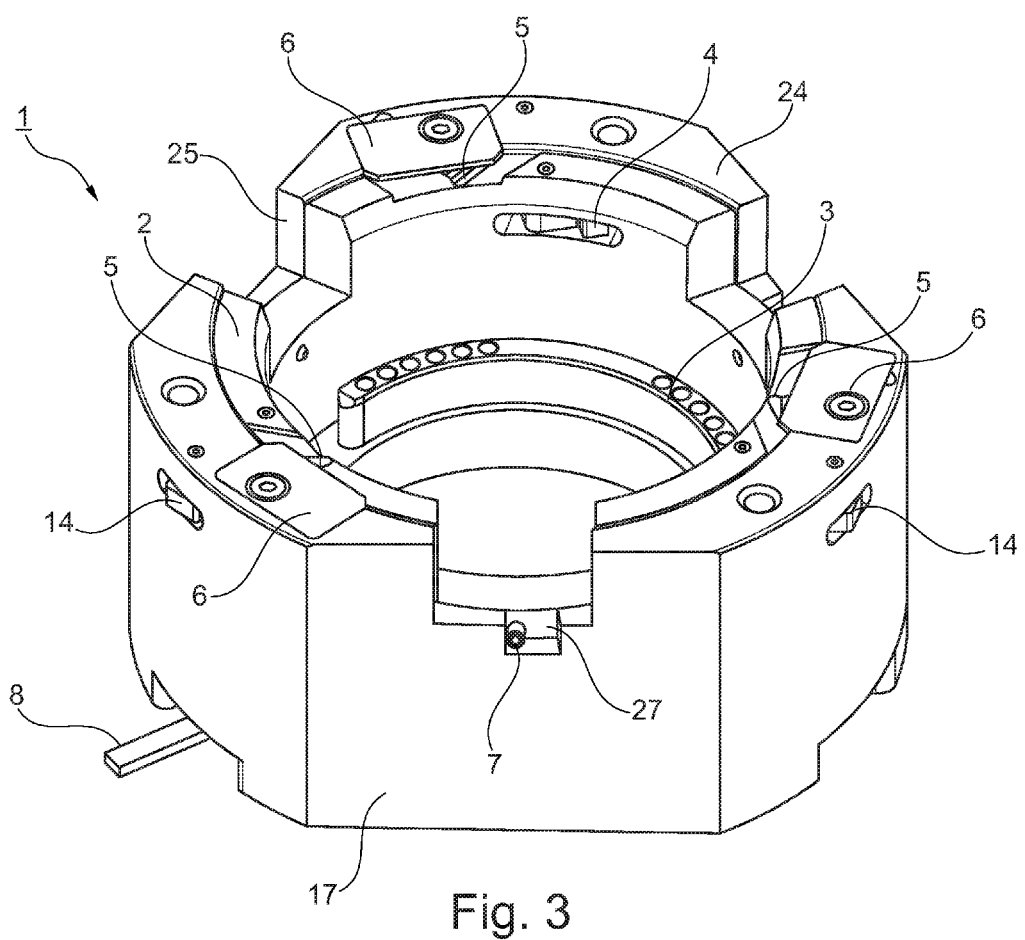
FIG. 3 is an enlarged view of a docking socket.

FIG. 3 shows a docking socket 1 in greater detail. The docking socket 1 is generally shaped as an inner sleeve 2 concentrically and rotatable disposed within a housing 24. The rotational axis is oriented parallel to the vertical axis. Vertical, plane faces 17 are provided in the exterior walls of the housing 24 in order to orient and rotationally lock the housing 24 with respect to the drawer 40 (FIG. 2). The relative rotational movement of the inner sleeve 2 in the housing 24 is limited by a stop pin 7 travelling in a circumferential groove 27.

Recesses 25 cut into the top of the housing 24 and inner sleeve 2 and extending radially through the walls thereof may insure the rotational orientation of a control unit (not shown) inserted into the docking socket.

A guide 3 attached to the inner sleeve has axially extending electrical docking connectors. The connectors are used for power supply and data exchange through a cable 8. The guide 3 orients a control unit (not shown) with respect to the docking socket. The electrical docking connectors are complementary to axially extending connectors on the control unit and provide electrical contacts to the control unit for power supply and data exchange through a cable 8.

A mechanical docking latch 4, 5, 6 is provided within the docking socket for locking a control unit to the docking socket. When activated, the docking latch retains the control unit firmly within the docking socket, such that the control unit does not disconnect from the docking connector when axially oriented forces are induced on the control unit.

In the preferred embodiment, the robotic gripper discussed above inserts an end of the control unit into the docking socket while the battery unit is still providing power to the electronic circuits within through connectors in the opposite end. The robotic gripper rotates the recorder/battery unit, and thereby the inner sleeve 2 relative to the housing 24. This rotation causes activation of the docking latch 4, 5, 6. When power is supplied through the electrical connectors in guide 3, the robotic gripper is controlled to remove the battery unit from the control unit by axial motion or a combination of rotations and axial motions.

As explained in greater detail below, a preferred embodiment comprises a spring 5 that provides a spring force holding the inner sleeve in a first position and holding a hook 4 inside a corresponding groove on a housing 24. The battery unit with the control unit is inserted into the docking socket and thereafter rotated. The inner sleeve is then rotated to a second position and the hook 4 is simultaneously activated to hold the control unit. The preferred embodiment shown on FIG. 3 has a stop pin 7 travelling in a groove 27 such that the permitted relative rotation of the two sleeves is limited by the stop shoulders at each end of the groove 27.

Other forces may, for example, be induced by the ship's motion or vibration. In some embodiments, the control units are moved from drawers or cabinets with the above mentioned power supply and data transfer capabilities to less expensive drawers or cabinets lacking these capabilities. Mechanical docking latches 4, 5, 6 should be provided even in such less expensive drawers. These latches need not necessarily be able to withstand forces required to remove or apply a battery unit, but they must be able to prevent the control units from falling out of the docking sockets in heavy sea and to withstand vibrations over an extended period of time without loosening.

The docking latch 4, 5, 6 must be releasable, such that its firm grip on the control unit is released when it is desired to remove the control unit from the docking socket 1, for example in order to insert it into a sensor capsule as described above.

As discussed, the docking latch is preferably operated by a combination of axial and rotational movements of the control unit in a manner similar to the axial and rotational movements performed by the robotic gripper in order to separate the battery unit from the control unit as described in the introduction. Thereby, latching the control unit to the docking socket can conveniently be carried out by the robotic gripper used to remove the battery unit from the control unit.

Further, a purely mechanical docking latch is preferred over one requiring electrical power or electrical control signals to operate. This simplifies the design of the apparatus in that power and control logic for the numerous docking latches in the cabinet 10 are not required. In addition, a drawer 40 loaded with mechanically latched control units can be stored in the less expensive cabinet (not shown) without any internal power connectors or controllers for the docking sockets when any acquired seismic data have been uploaded and testing and maintenance procedures are performed.

As depicted on FIG. 3, such a preferred mechanical docking latch comprises three hooks 4 disposed around the inner circumference of the docking socket. Complementary grooves are arranged on the exterior surface of the control unit, such that the control unit is firmly attached to the docking socket 1 when the hooks 4 engage in the complementary grooves. As shown in the embodiment on FIG. 3, each hook 4 is connected to a spring loaded mechanism 5 accessible under a cover 6.

A simple spring loaded mechanism working in the intended manner comprises a hook 4 that can pivot about a vertical pivot axis between an inactive position, such as the one shown in FIG. 3, where the hook is retracted into the inner sleeve, and an active position where the hook is extended and engaging a complementary groove on the control unit. The spring 5 is attached to an attachment pin on a lever 14 on the hook 4 at one end and to the outer housing 24 at its opposite end. In the inactive position, the attachment pin is at a first side of the pivot axis such that the spring force pulls the hook into a retracted position. When the hook is pivoted to its active position, the attachment pin is displaced to the opposite side of the pivot axis such that the spring force pulls the hook toward its extended position. In order to convert a rotation of the inner sleeve 2 to a pivot motion of the hook 4, the pivot axle is attached to the inner sleeve 2 and the lever 14 extends into a groove in the outer housing 24.

The lever 14 may be extended through the housing 24 as shown on FIG. 3. Thus, in an alternative to the spring loaded mechanism above, the lever 14 can be operated from outside the housing 24 in order to pivot the hook 4. However, it is understood from the above description that the lever does not need to extend through the entire wall of the housing 24. Any link between the outer housing 24 and a point displaced from the pivot axle attached to the inner sleeve 2 will cause the hook 4 to pivot due to a relative rotation between the inner sleeve 2 and the housing 24.

Thus, with a link provided between the lever 14 and the outer housing 24 as described, a rotation of the inner sleeve 2 within the housing 24 is equivalent to pivoting the hook 4. It follows that the length of groove 27, which limits the rotation of sleeve 2 in the housing 24 due to the pin 7 travelling therein, can be adapted to limit the hook 4 to pivot between its inactive and active positions. Also, as indicated above, the rotational force required to overcome the spring force in order to open or close the latch can be far less than the rotational force applied by the robotic gripper in order to connect or disconnect the battery unit due to the pin 7 engaging an end of groove 27. For example, it does not matter that the latch opens before a battery unit is properly attached provided the power supply through the docking socket is not interrupted until the battery unit is properly attached and able to provide the power required for timers etc. within the sensor module.

The expression "pin in circumferential groove" in the claims is due to the fact that it is irrelevant whether the pin is attached to the inner sleeve and the groove is provided in the housing or vice versa.

Figure 4:
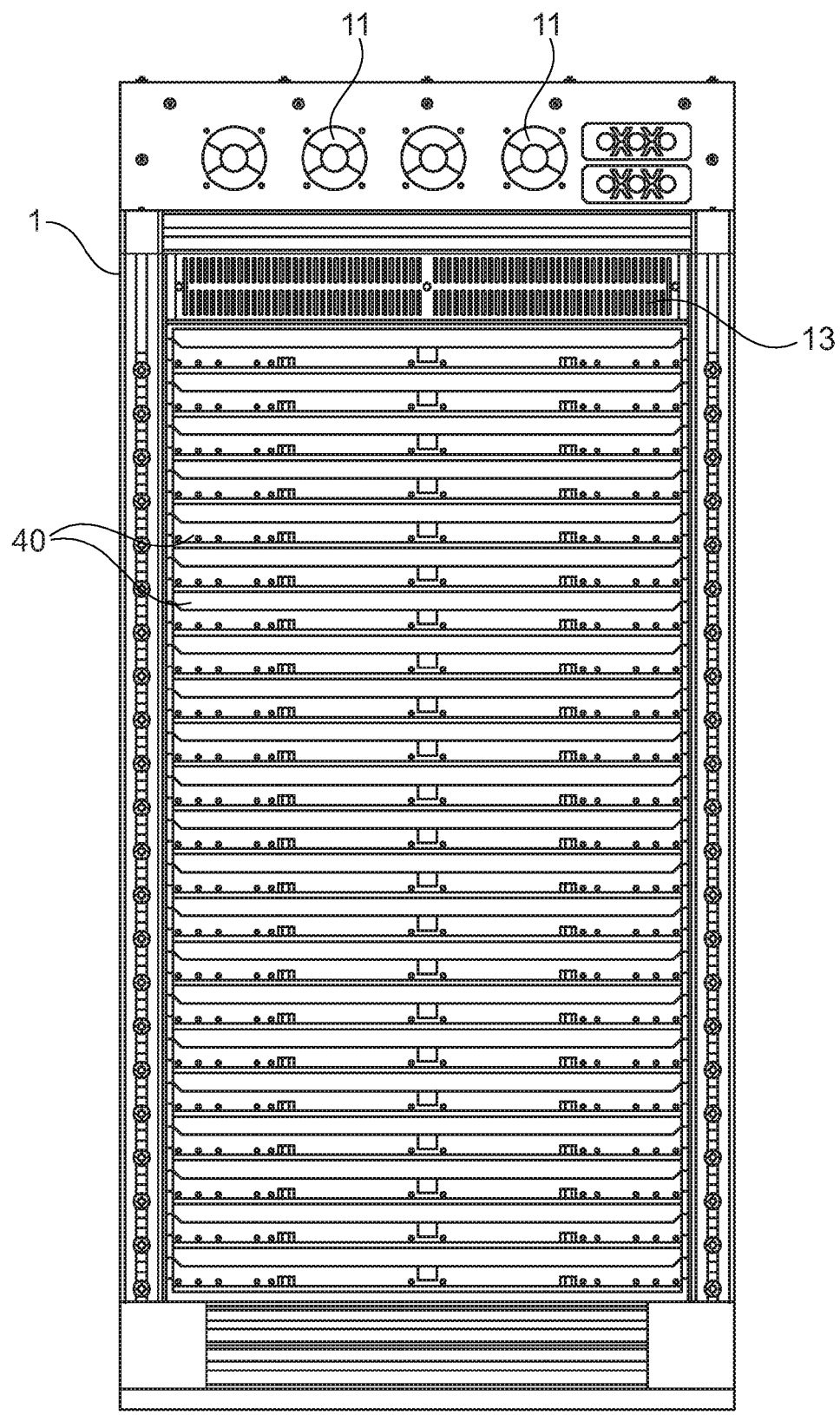
FIG. 4 is a front view of the apparatus on FIG. 1.

FIG. 4 shows the cabinet 10 seen from the front, i.e. along the longitudinal axis. Several (empty) drawers 40 extend in the lateral direction from left to right on FIG. 4, and above each other from bottom to top along the vertical axis. The fans 11 and an adjustable grille 13 circulates air within the cabinet 10 in order to remove excess heat generated when control units are inserted in the docking sockets of each drawer 40 for upload of seismic data and/or maintenance.

Figure 5:
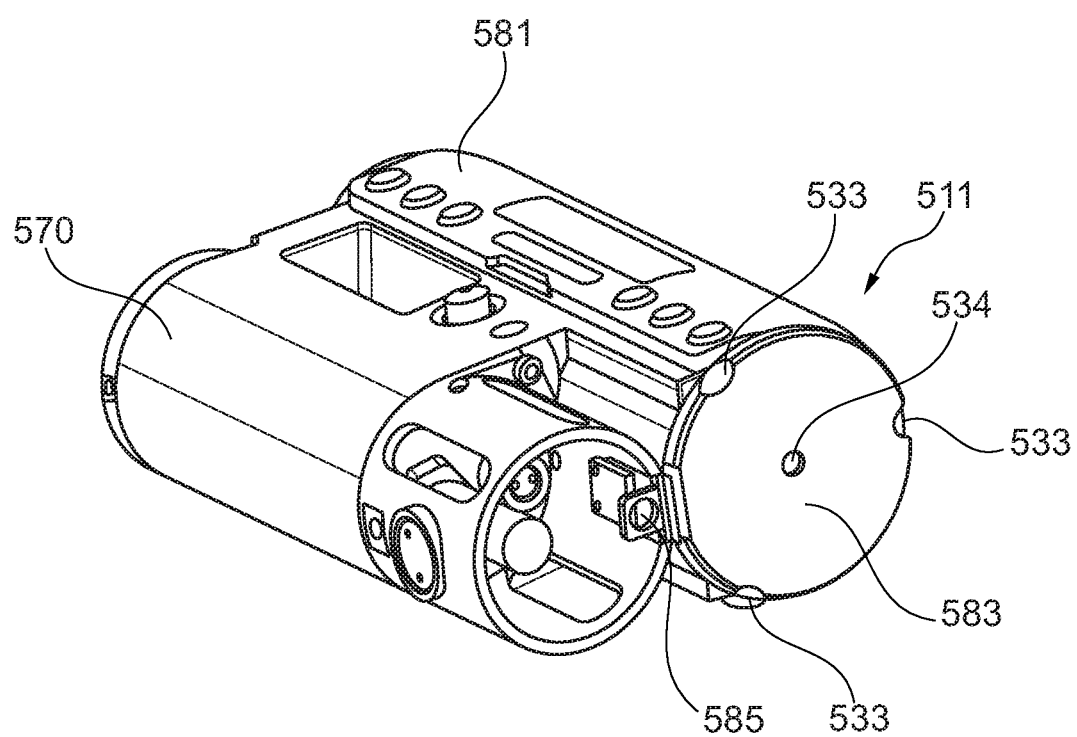
FIG. 5 is a perspective view an autonomous sensor capsule.

FIG. 5 shows an embodiment of an autonomous sensor capsule 511 comprising two substantially cylindrical bodies arranged side by side. The first cylindrical body is the sensor section 570, which contains geophones, hydrophones, accelerometers and or other seismic sensor suitable for the survey at hand.

The second cylindrical body is the control/battery section 581, which contains a control unit connected to a battery unit into a control/battery-unit. The control/battery-unit is disposed within the control/battery section 581 behind a lid 583. Positioning grooves 533 are arranged at a distance from each other around the circumference of the lid 583. A threaded hole 534 is arranged in the centre of lid 583. The threaded hole 534 can be engaged by a complementary threaded bolt (not shown) when the control/battery-unit is inserted into the control/battery-section 581 or withdrawn therefrom.

While the invention has been described with reference to exemplary embodiments, the full scope of the invention is defined by the appended claims.

The invention claimed is:

1. An apparatus for storing control units comprising:
   a cabinet having a plurality of rails arranged horizontally along inner sidewalls and configured to receive a plurality of drawers above each other;
   at least one drawer constructed to be inserted or withdrawn from a pair of the plurality of rails, wherein each drawer comprises a plurality of docking sockets, each docking socket being configured to receive and retain a control unit; and
   a robotic elevator device adapted to move an elevator table in a vertical direction to a vertical position corresponding to the pair of rails into which the drawer is to be inserted or from which the drawer is to be withdrawn, wherein the elevator table comprises a linear motor constructed to move the drawer along the pair of rails in a longitudinal direction.

2. The apparatus according to claim 1, wherein markers are disposed on the cabinet at known positions and corresponding readers are disposed on the elevator table, and the apparatus further comprises a controller configured to adjust the alignment of the elevator table depending on an output from the readers.

3. The apparatus according to claim 1, wherein at least one of the docking sockets comprises electrical connectors for power supply and data transmission between a seismic data recorder retained therein and a controller external to the apparatus.

4. The apparatus according to claim 3, wherein markers are disposed on the cabinet at known positions and corresponding readers are disposed on the elevator table, and the apparatus further comprises a controller configured to adjust the alignment of the elevator table depending on an output from the readers.

5. The apparatus according to claim 1, wherein the robotic elevator device comprises mechanical alignment means providing a unique fixation position, wherein the drawer can be mechanically aligned in three dimensions with high precision at the fixation position.

6. The apparatus according to claim 1, further comprising a robotic gripper constructed to insert a control unit into any one of the plurality of docking sockets in the drawer.

7. The apparatus according to claim 6, wherein the elevator table comprises markers at known positions for calibrating the alignment of the robotic gripper.

8. The apparatus according to claim 6, wherein the mechanical alignment means are mounted on the same frame as the robotic gripper.

9. The apparatus according to claim 1, further comprising an electronic master unit constructed to address each individual docket socket and retrieve seismic data stored in a control unit inserted therein.

10. The apparatus according to claim 9, wherein the master control unit is further constructed to perform testing and maintenance of software, firmware and/or programmable hardware within the control unit.

11. The apparatus according to claim 9, wherein the drawer further comprises an onboard controller capable of addressing each docking socket on the drawer on behalf of the master control unit.

12. The apparatus according to claim 1, wherein each docking socket comprises a mechanical latch, wherein a spring attached to a lever provides a spring force holding a hook in engagement with a corresponding groove on a control unit, and wherein the spring force must be overcome to release the control unit from the docking socket.

13. The apparatus of claim 12, wherein the docking socket comprises an inner sleeve rotatable disposed in an outer housing, wherein the lever is rigidly attached to the hook, pivotally attached to a vertical pivot axle affixed to the inner sleeve and further linked to the outer housing, whereby a relative rotation of the inner sleeve within the housing causes the lever and hook to pivot about the pivot axle.

14. The apparatus of claim 13, wherein a stop pin travelling in a circumferential groove limits the relative rotation between the inner sleeve and the housing.

15. The apparatus of claim 14, wherein the length of the circumferential groove determines the pivoting motion of the hook such that the hook is in a retracted position when the pin is at one end of the circumferential groove and in a locking position when the pin is at the opposite end of the circumferential groove.

* * * * *